United States Patent
Shi et al.

(10) Patent No.: US 10,755,979 B2
(45) Date of Patent: Aug. 25, 2020

(54) WAFER-LEVEL PACKAGING METHODS USING A PHOTOLITHOGRAPHIC BONDING MATERIAL

(71) Applicant: Ningbo Semiconductor International Corporation, Ningbo (CN)

(72) Inventors: Hu Shi, Ningbo (CN); Mengbin Liu, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 0 days.

(21) Appl. No.: 16/236,564

(22) Filed: Dec. 30, 2018

(65) Prior Publication Data

US 2020/0135689 A1    Apr. 30, 2020

Related U.S. Application Data

(63) Continuation of application No. PCT/CN2018/116848, filed on Nov. 22, 2018.

(30) Foreign Application Priority Data

Oct. 31, 2018 (CN) .......................... 2018 1 1283751

(51) Int. Cl.
*H01L 21/768* (2006.01)
*H01L 25/00* (2006.01)
(Continued)

(52) U.S. Cl.
CPC ...... *H01L 21/76898* (2013.01); *H01L 21/565* (2013.01); *H01L 23/3107* (2013.01);
(Continued)

(58) Field of Classification Search
CPC . H01L 25/042; H01L 25/0655; H01L 25/072; H01L 25/0753; H01L 25/115;
(Continued)

(56) References Cited

U.S. PATENT DOCUMENTS

2008/0169548 A1    7/2008  Baek
2011/0186960 A1*   8/2011  Wu ........................ H01L 21/486
                                                   257/508
(Continued)

FOREIGN PATENT DOCUMENTS

CN    102593023 A    7/2012
CN    103400808 A    11/2013
(Continued)

*Primary Examiner* — Scott B Geyer
(74) *Attorney, Agent, or Firm* — Anova Law Group, PLLC

(57) ABSTRACT

A wafer-level packaging method includes providing a base substrate and providing first chips. A photolithographic bonding layer is formed on the base substrate or on the first chips. First vias are formed in the photolithographic bonding layer. The first chips are pre-bonded to the base substrate through a photolithographic bonding layer with each first chip corresponding to a first via. A thermal compression bonding process is used to bond the first chips to the base substrate such that an encapsulation material fills between adjacent first chips and covers the first chips and the base substrate. The base substrate is etched to form second vias through the base substrate with each second via connected to a first via to form a first conductive via. A first conductive plug is formed in the first conductive via to electrically connect to a corresponding first chip.

20 Claims, 7 Drawing Sheets

(51) Int. Cl.
  *H01L 23/00* (2006.01)
  *H01L 21/56* (2006.01)
  *H01L 23/31* (2006.01)
(52) U.S. Cl.
  CPC .......... *H01L 23/3121* (2013.01); *H01L 24/27* (2013.01); *H01L 24/29* (2013.01); *H01L 24/32* (2013.01); *H01L 24/83* (2013.01); *H01L 25/50* (2013.01); *H01L 2224/271* (2013.01); *H01L 2224/27436* (2013.01); *H01L 2224/27515* (2013.01); *H01L 2224/27618* (2013.01); *H01L 2224/2919* (2013.01); *H01L 2224/29034* (2013.01); *H01L 2224/32145* (2013.01); *H01L 2224/83048* (2013.01); *H01L 2224/83203* (2013.01); *H01L 2224/83862* (2013.01); *H01L 2224/83951* (2013.01)
(58) Field of Classification Search
  CPC ... H01L 23/28–3192; H01L 21/56–568; H01L 2924/181–186; H01L 21/768–76898; H01L 23/522–53295; H01L 21/3205–32155; H01L 21/823475; H01L 2221/10–1094; H01L 25/043; H01L 25/0657; H01L 25/074; H01L 25/0756; H01L 25/117
  See application file for complete search history.

(56) References Cited

U.S. PATENT DOCUMENTS

| | | | | |
|---|---|---|---|---|
| 2015/0371951 A1* | 12/2015 | Yeh | ..................... | H01L 25/0657 257/774 |
| 2016/0071820 A1* | 3/2016 | Yu | ........................ | H01L 21/6835 257/737 |
| 2016/0218082 A1* | 7/2016 | Lee | ........................ | H01L 24/20 |
| 2017/0141040 A1* | 5/2017 | Yu | ..................... | H01L 21/31051 |
| 2017/0162556 A1* | 6/2017 | Lin | ..................... | H01L 23/4334 |
| 2017/0345793 A1* | 11/2017 | Miyairi | ................... | H01L 24/02 |
| 2018/0366436 A1* | 12/2018 | Wang | ................... | H01L 25/0652 |
| 2019/0027451 A1* | 1/2019 | Kim | ..................... | H01L 23/5283 |

FOREIGN PATENT DOCUMENTS

| | | |
|---|---|---|
| CN | 106952837 A | 7/2017 |
| CN | 107633997 A | 1/2018 |
| CN | 108666264 A | 10/2018 |

\* cited by examiner

WAFER-LEVEL PACKAGING METHODS USING A PHOTOLITHOGRAPHIC BONDING MATERIAL

CROSS-REFERENCES TO RELATED APPLICATIONS

This application is a continuation application of PCT patent application No. PCT/CN2018/116848, filed on Nov. 22, 2018, which claims the priority of Chinese patent application No. 201811283751.3, filed on Oct. 31, 2018, the entire content of which is incorporated herein by reference.

FIELD OF THE DISCLOSURE

The present disclosure generally relates to the field of semiconductor fabrication technology and, more particularly, relates to wafer-level packaging methods using a photolithographic bonding materials.

BACKGROUND

With the development trend of ultra-large-scale integrated circuits (ICs), the feature size of ICs continues to decrease, and accordingly, the requirements for IC packaging technology also become higher. System in package (SIP) combines multiple active components, passive components, micro-electromechanical systems (MEMS), optical components, and other components with different functions into a single unit to form a system or a sub-system that is capable of providing multiple functions and allows heterogeneous IC integration. Compared with system on chip (SOC), SIP demonstrates relatively simple integration, shorter design cycle and market cycle, lower cost, and other advanced characteristics. SIP can be used to realize a more complex system, and thus it is a relatively common packaging technology.

Currently, in order to meet the goals for reducing the cost, improving the reliability, improving the speed, and increasing the density for IC packages, advanced packaging methods mainly adopt wafer-level system in package (WLSIP) and panel-level system in package (PLSIP). Compared to traditional SIP, WLSIP and PLSIP complete the packaging process on wafers or on panels, and thus demonstrate a number of advantages, such as greatly reducing the area of the package structure, reducing the manufacturing cost, optimizing the electrical performance, capable for batch production, etc. Therefore, WLSIP and PLSIP can significantly reduce the workload and the requirements on equipment.

However, the packaging efficiency and the yield and the reliability of the package structure for existing WLSIP and PLSIP may need to be further improved. The disclosed WLP methods using a photolithographic bonding material are directed to solve one or more problems set forth above and other problems in the art.

BRIEF SUMMARY OF THE DISCLOSURE

One aspect of the present disclosure provides a wafer-level packaging (WLP) method using a photolithographic bonding material. The method includes providing a base substrate; providing a plurality of first chips; forming a photolithographic bonding layer on the base substrate or on the plurality of first chips; forming a plurality of first vias in the photolithographic bonding layer by patterning the photolithographic bonding layer; and pre-bonding the plurality of first chips to the base substrate through the photolithographic bonding layer. Each first chip of the plurality of first chips corresponds to a first via of the plurality of first vias. The method also includes providing an encapsulation material, and using a thermal compression bonding process to bond the plurality of first chips to the base substrate such that the encapsulation material fills up space between adjacent first chips and covers the plurality of first chips and the base substrate. After bonding the plurality of first chips to the base substrate, the method includes etching the base substrate from a surface that faces away from the plurality of first chips to form a plurality of second vias passing through the base substrate. Each second via of the plurality of second vias is connected to a first via of the plurality of first vias to form a first conductive via. The method further includes forming a first conductive plug in the first conductive via to electrically connect to a corresponding first chip.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
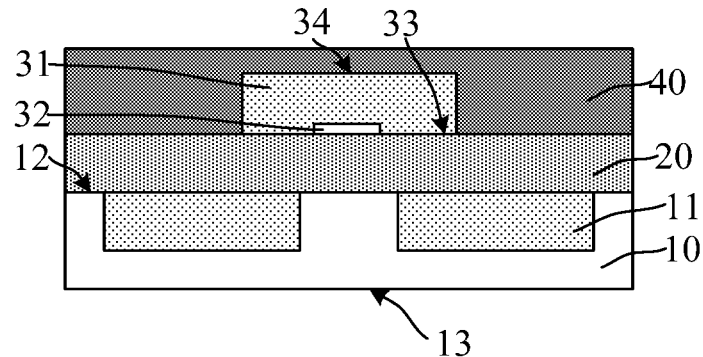
FIGS. 1-2 illustrate schematic views of structures at certain stages of a packaging method.

In the following description, numerous specific details are set forth to provide a more thorough understanding of the disclosure. However, it will be apparent to those skilled in the art that the present disclosure may be implemented without one or more of these details. In other instances, some of the technical features well known in the art are described herein to avoid confusion with the present disclosure.

It should be understood that the disclosed methods and structures can be implemented in various forms and should not be construed as limited to the embodiments set forth in the present disclosure. Instead, these embodiments are provided so that the present disclosure will be thorough and complete. In the accompanying drawings, the size and relative dimensions of the layers and regions may be enlarged for clarity. The same reference numbers indicate the same elements throughout the present disclosure.

It should be understood that when an element or layer is referred to as "on", "adjacent to", "connected to" or "coupled to" another element or layer, it may be directly placed on the other element or layer, or may be adjacent to, connected to, or coupled to the other element or layer. Alternatively, the element or layer may be indirectly placed on the other element or layer, or may be adjacent to, connected to, or coupled to the other element or layer as some intermediate elements and/or layers are disposed between. In contrast, when an element is referred to as "directly on", "directly adjacent to", "directly connected to", or "directly coupled to" another element or layer, no intermediate element or layer is disposed between.

It should be understood that although the terms such as first, second, third, etc. are used to describe various components, regions, layers, and/or portions, these components, regions, layers, and/or portions should not be limited by the terms of first, second, third, etc. These terms are merely used to distinguish an element, component, region, layer, or portion. Therefore, a first element, component, region, layer, or portion discussed in the present disclosure may be alternatively represented as a second element, component, region, layer, or portion.

Spatial relationship terms such as "under", "below", "the lower", "underneath", "above", "the upper", etc. are used here for illustrative purposes. The terms may be used to describe the relationship of one element or feature shown in a figure with respect to other elements or features. It should be understood that in addition to the orientation shown in the figures, the spatially relative terms are intended to encompass different orientations of the device in use and operation. For example, when a device in the figures is flipped, an element or feature described as "under another element", "under", or "below" may be oriented "above" the other element or feature. Thus, the exemplary terms "below" and "under" may include both up and down directions. A device may be otherwise oriented (e.g. rotated 90 degrees or oriented to other orientation), and the spatial descriptive terms used herein may be interpreted accordingly.

The terms used herein are merely for the purpose of describing the particular embodiments and are not intended to limit the scope of the present disclosure. When using the singular forms such as "a", "one", and "the/this", these terms are also intended to include the plural forms, unless otherwise specified in the context. It should also be understood that when the terms "composed of" and/or "comprising" are used in the specification, they are intended to describe the presence of features, integers, steps, operations, elements, and/or components, but not to exclude the presence or addition of one or more other features, integers, steps, operations, elements, components, and/or groups. When used in the present disclosure, the term "and/or" includes any and all combinations of the listed related items.

Various embodiments of the present disclosure are described herein with reference to schematic illustrations of cross-sectional views of the structures (and intermediate structures) according to the preferred embodiments of the present disclosure. Thus, deviations from the illustrated shapes may be expected due to, e.g. manufacturing techniques and/or tolerances. Therefore, the embodiments of the present disclosure should not be limited to the specific shapes of the regions illustrated herein, but should include variations in the shapes due to, e.g. manufacturing. For example, an implanted region shown as a rectangle typically has rounded or curved features and/or an implantation gradient at the edges, rather than has a binary change from the implanted region to the non-implanted region. Similarly, a buried region formed by implantation can result in some implantation in the region between the buried region and the surface through which the implantation is performed. Therefore, the regions shown in the figures are illustrative and the shapes of the regions are not intended to represent the actual shapes of the regions of the device, and thus, the shapes of the regions are not intended to limit the scope of the present disclosure.

In order to make the present disclosure easy to understand, detailed steps and structures will be provided to explain the technical solutions of the present disclosure. In the following, various preferred embodiments of the present disclosure are described in detail. However, it should be noted that in addition to the embodiments described herein, the present disclosure may be implemented in other forms.

Figure 2:
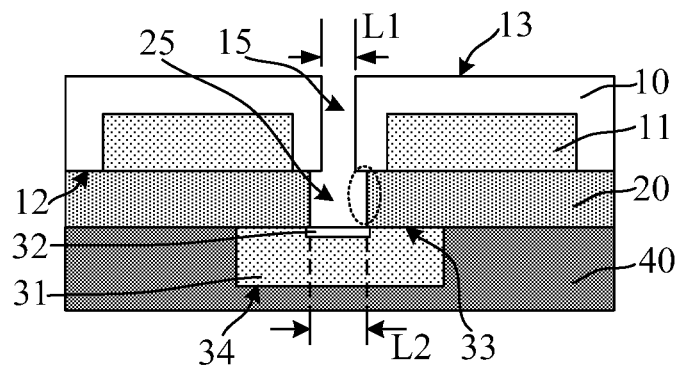

Currently, the yield and the reliability of package structures formed by existing packaging methods still need to be improved. In the following, an example will be provided to explain why the yield and the reliability of the package structure need to be improved. FIGS. 1-2 illustrate schematic views of structures at certain stages of a packaging method.

Referring to FIG. 1, a device wafer 10 is provided. The device wafer 10 has a wafer front side 12 and a wafer back side 13 in opposite to the wafer front side 12. A plurality of first chips 11 is integrated on the wafer front side 12. For illustrative purposes, only two first chips are shown in FIG. 1 and FIG. 2. Moreover, a bonding layer 20 is formed on the wafer front side 12. A plurality of second chips 31 is provided. For illustrative purposes, only one second chip 31 is shown in FIG. 1 and FIG. 2. The second chip 31 has a chip front side 33 and a chip back side 34 in opposite to the chip front side 33. A soldering pad 32 is formed in the second chip 31, and is exposed on the chip front side 33.

Further, referring to FIG. 1, the device wafer 10 is bonded to the second chip 31 through the bonding layer 20. After bonding, an encapsulation layer 40 is formed on the portion of the bonding layer 20 exposed by the second chip 31. The encapsulation layer 40 covers the second chip 31.

Referring to FIG. 2, after forming the encapsulation layer 40, the wafer back side 13 and the bonding layer 20 are sequentially etched through a through-silicon via process. As such, a first via 15 is formed in the device wafer 10, and a second via 25 is formed in the bonding layer 20. The second via 25 is connected to the first via 15 and exposes the soldering pad 32. The second via 25 and the first via 15 together form a conductive via (not labeled).

The through-silicon via process is usually a reactive ion etching (RIE) process. The opening dimension L2 (referring to FIG. 2) and the topography of the second via 25 are mainly determined by the topography of the first via 15 and the etching process. During the RIE process, polymer by-products that cannot react with the etching gas are generated. The by-products may be easily attached to the sidewall of the opening to prevent lateral etching. However, the etching gas adopted during the etching process mainly contains $O_2$ because the bonding layer 20 is made of an organic material. Moreover, most of the by-products generated during the etching process are gases. Therefore, in the process of etching the bonding layer 20, the sidewall of the second via 25 may not be effectively protected, and lateral etching may thus be severe. Therefore, after forming the second via 25, the opening dimension L1 (referring to FIG. 2) of the first via 15 may be likely smaller than the opening dimension L2 of the second via 25. When the thickness of the bonding layer 20 is large, the problem that the opening dimension L2 of the second via 25 becomes overly large may be even more severe.

In order to realize electrical connection, a conductive plug is formed in the conductive via using the electroplating technology. Because the opening dimension L1 of the first via 15 is smaller than the opening dimension L2 of the second via 25, a trench (as indicated by the dashed circle in FIG. 2) surrounded by the device wafer 10, the sidewall of the second via 25, and the encapsulation layer 40, is easily formed. Therefore, the material of the conductive plug may be difficult to completely fill the trench, or may even not be able to fill the trench. As such, the performance of the electrical connection of the conductive plug may be degraded, and thus the yield and the reliability of the package structure may be reduced.

Moreover, the current packaging process is to bond a plurality of second chips 31 to the device wafer 10 or other substrate in a one-by-one manner. Because the number of the second chips 31 is large, in order to reduce the process cycle of the packaging process, a short bonding time is required. However, such a short bonding time may reduce the bonding strength between the second chip 31 and the device wafer 10. As such, the yield and the reliability of the package structure may be reduced.

The present disclosure provides a WLP method to improve the yield and the reliability of package structure. According to the embodiments of the present disclosure, a first via is formed in a bonding layer through a photolithography process, and a second via is then formed by etching the base substrate. As such, the problem of having the opening dimension of the first via larger than the opening dimension of the second via may be avoided. In addition, the precision of the opening dimension of the via formed through the photolithography process may also be improved. Accordingly, when a first conductive plug is subsequently formed in a first conductive via, which is formed by the first via and the second via, to electrically connect to the first chip, the disclosed WLP method may be conducive to reducing the difficulty in forming the first conductive plug in the first via and improving the formation quality of the first conductive plug in the first via. Therefore, the performance of the electrical connection of the first conductive plug may be improved, which may improve the yield and the reliability of the package structure. Moreover, after the base substrate and the first chip are pre-bonded together through the bonding layer disposed therebetween, a thermal compression bonding process is used to simultaneously implement the bonding of the base substrate and the first chip and the packaging of the first chip and the base substrate using the encapsulation layer. Therefore, while the high bonding strength between the base substrate and the first chip is ensured, the process cycle of the packaging process is reduced, and thus the packaging efficiency and the production capacity may be improved.

The objects, features, and advantages of the present disclosure described above will become more apparent from the following detailed description of various embodiments with references to the accompanying drawings.

Figure 13:
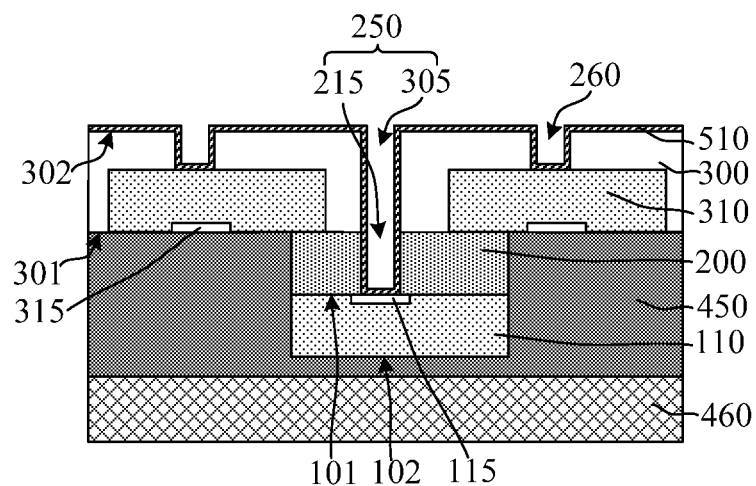
Figure 14:
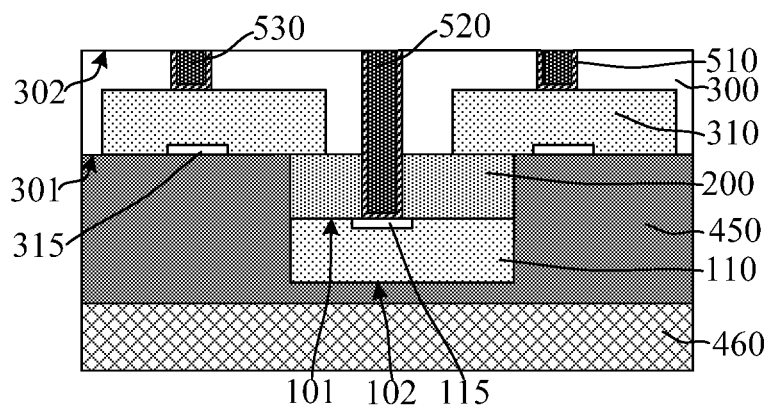
Figure 15:
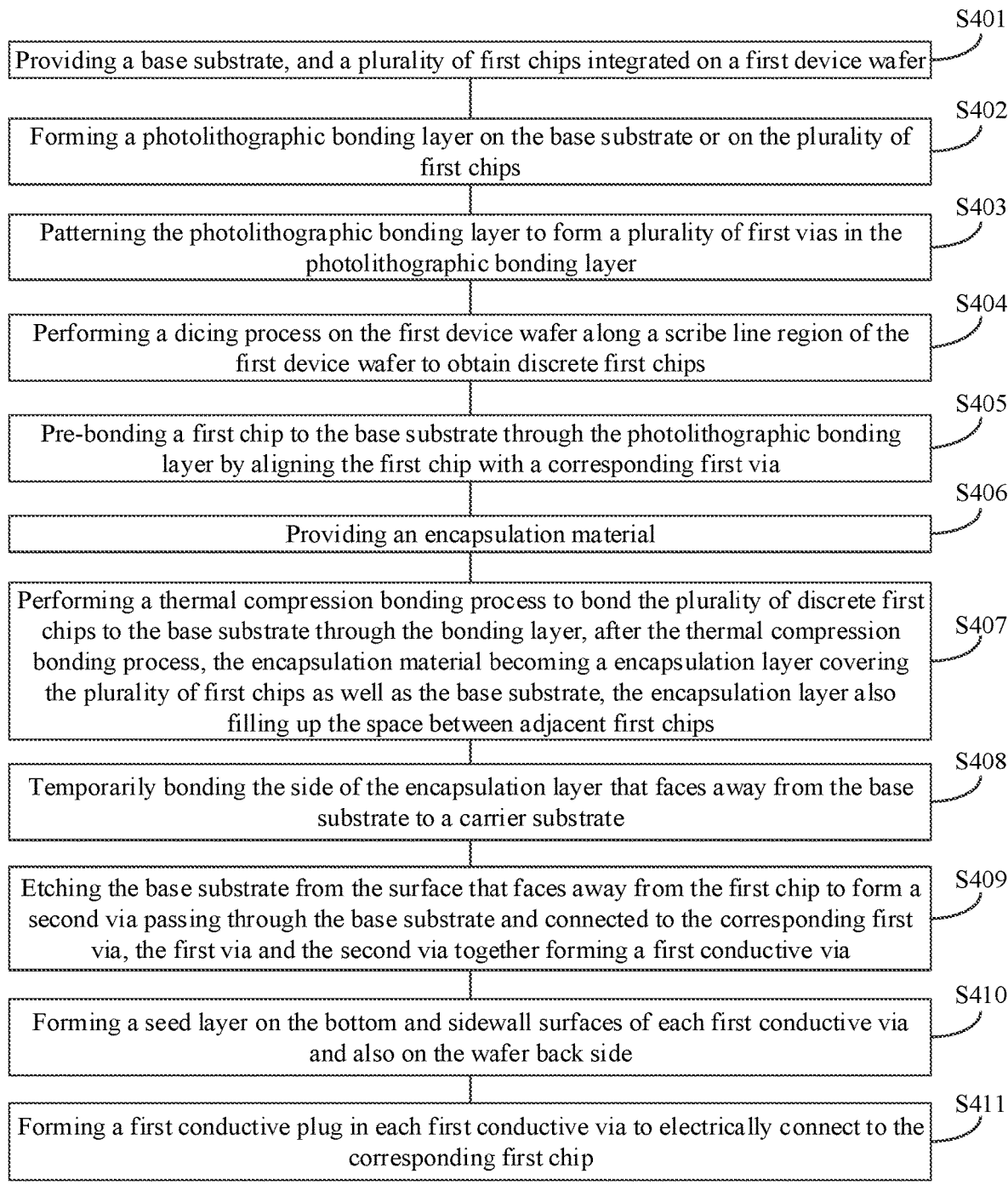
FIG. 15 illustrates a flowchart of an exemplary WLP method using a photolithographic bonding material according to various embodiments of the present disclosure.

FIG. 15 illustrates a flowchart of an exemplary WLP method using a photolithographic bonding material according to various embodiments of the present disclosure. FIGS. 3-14 illustrate schematic views of structures at certain stages of the exemplary WLP method using a photolithographic bonding material.

Figure 3:
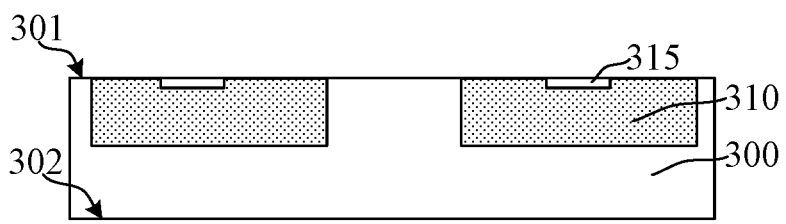
FIGS. 3-14 illustrate schematic views of structures at certain stages of an exemplary wafer-level packaging (WLP) method using a photolithographic bonding material according to various embodiments of the present disclosure.
Figure 4:
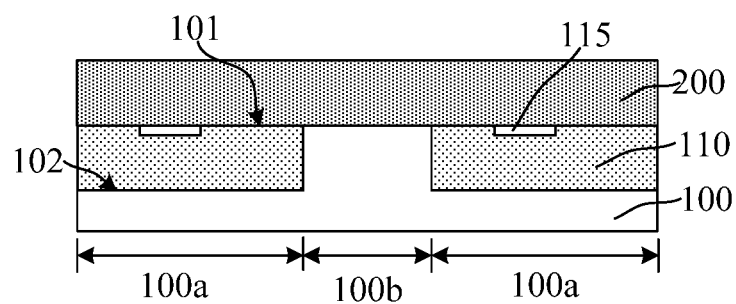

Referring to FIG. 15, a base substrate and a plurality of first chips integrated on a first device wafer may be provided (S401). FIG. 3 illustrates a schematic cross-sectional view of a base substrate consistent with various embodiments of the present disclosure, and FIG. 4 illustrates a schematic cross-sectional view of a first chip consistent with various embodiments of the present disclosure.

In one embodiment, the disclosed packaging method may be used to implement wafer-level system in package (WLSIP) or panel-level system in package (PLSIP). Accordingly, a base substrate 300 (referring to FIG. 3) and a plurality of first chips 110 (referring to FIG. 4) may be provided. In one embodiment, the plurality of first chips 110 may be integrated on a first device wafer.

When the packaging method is used to implement WLSIP, the base substrate 300 may be a complementary metal-oxide-semiconductor (CMOS) wafer or a carrier wafer. The carrier wafer may be a glass or a silicon-based substrate. For example, the carrier wafer may be a semiconductor substrate (e.g., silicon substrate) wafer, an inorganic glass wafer, an organic glass wafer, an oxide crystal wafer, a ceramic wafer, a metal wafer, or an inorganic oxide wafer, etc.

When the packaging method is used to implement PLSIP, the base substrate 300 may be a panel. The panel may have a square, rectangular, or any other appropriate shape. The dimension of the panel is usually large such that more chips can be packaged on a single panel, which is beneficial to reducing the packaging cost and also demonstrates advantages of economies of scale. For example, the panel may be a printed wire board (PWB), a printed circuit board (PCB), a double-layer printed board, a multilayer printed board, a flexible circuit board, etc.

In one embodiment, the packaging method is used to implement WLSIP, and according to the actual process needs, the base substrate 300 is a device wafer. For example, the base substrate 300 may be defined as a second device wafer.

The second device wafer may be a wafer for completing the device, and may be fabricated through the integrated circuit fabrication technology. Accordingly, a plurality of second chips 310 may be integrated in the second device. A first soldering pad 315 may be formed in each second chip 310, and the first soldering pad 315 may be used to realize the electrical connection between the second chip 310 and other electrical circuit. For example, the first soldering pad 315 may be a lead pad.

In one embodiment, the surface of the second device wafer exposing the first soldering pad 315 may be a wafer front side 301, and the surface of the second device wafer in opposite to the wafer front side 301 may be a wafer back side 302. That is, the wafer back side 302 may refer to the back side of the substrate of the second device wafer that is far away from the first soldering pad 315.

In one embodiment, the base substrate 300 may have a first to-be-bonded surface (not labeled) that is used for bonding the first chip 110.

In one embodiment, according to the process needs, the first to-be-bonded surface may be the wafer front side 201. In other embodiments, the first to-be-bonded surface may be the wafer back side. In some embodiments, when the base substrate is a substrate of other type, the first to-be-bonded surface may be any appropriate surface of the base substrate. For example, the first to-be-bonded surface may be the front side or the back side of a glass substrate or any other silicon-based substrate.

The plurality of first chips 110 may have at least one functional type. That is, the functional types of the plurality of first chips 110 may include at least one type. For example, the first chip 110 may be a memory chip, a communication chip, a processing chip, a flash chip, a logic chip, etc. In other embodiments, the first chip may have any other appropriate function.

In one embodiment, the WLSIP may be used to combine a plurality of first chips 110 having various different functions into a package structure. Therefore, each or some first chips 110 in the plurality of first chips 110 may have different functions. The plurality of first chips 110 may be obtained by cutting a plurality of device wafers with different functional types. In other embodiments, according to the actual process needs, the functional types of the plurality of first chips may be the same.

The first chip 110 may be fabricated using IC manufacturing technology. Therefore, a second soldering pad 115 may be formed in each first chip 110. The second soldering pad 115 may be used to realize the electrical connection between the first chip 110 and other electrical circuit. For example, the second soldering pad 115 may be a lead pad.

In one embodiment, the surface of the first chip 110 exposing the second soldering pad 115 may be the chip front side 101, and the surface of the first chip 110 in opposite to the chip front side 101 may be the chip back side 102. That is, the chip back side 102 may refer to the back side of the substrate of the first chip 110 that is far away from the second soldering pad 115.

In one embodiment, the first chip 110 may have a second to-be-bonded surface (not labeled) that is used for bonding the base substrate 300.

In one embodiment, according to the process needs, the first chip 110 may be bonded to the base substrate 300 with the first chip 110 facing down. Therefore, the chip front side 101 may be the second to-be-bonded surface. By using the chip front side 101 as the second to-be-bonded surface, subsequently etching the first chip 110 using a through-silicon via process may be prevented, which may be conducive to reducing the production cost as well as the process complexity. In other embodiments, when the first chip is bonded to the base substrate with the first chip facing up, the chip back side may be the second to-be bonded surface of the first chip.

It should be noted that for illustrative purposes, only two first chips 110 are shown in FIG. 4.

In one embodiment, during the step of providing the plurality of first chips 110, the plurality of first chips 110 may be integrated in the first device wafer 110. Referring to FIG. 4, taking a structure including a plurality of first chips 110 with a same function type as an example, the step of providing the plurality of first chips 110 may include: providing a first device wafer 100, including a plurality of device regions 110a and a scribe line region 100b surrounding the plurality of device regions 110a, and integrating the plurality of first chips 110 in the plurality of device regions 100a of the first device wafer 100.

Accordingly, when the WLSIP is used to combine a plurality of first chips 110 with different functions into a package structure, during the step of providing the plurality of first chips 110, a plurality of first device wafers 100 in different functional types may need to be provided.

In other embodiments, during the step of providing the plurality of first chips, the plurality of first chips may be separated from each other.

Further, referring to FIG. 15, a photolithographic bonding layer may be formed on the base substrate or on the plurality of first chips (S402). FIG. 4 illustrates a schematic structural view of a photolithographic bonding layer formed on a first chip.

In one embodiment, the disclosed packaging method may also include forming a photolithographic bonding layer 200 on the base substrate 200 or on the plurality of first chips 110. For example, referring to FIG. 4, a photolithographic bonding layer 200 may be formed on the first chip 110. The bonding layer 200 may be used to physically connect the first chip 110 and the base substrate 300.

Compared to an adhesive layer, the bonding layer may have higher bonding strength, and also have desired chemical resistance, acid and alkali resistance, as well as high temperature resistance. In addition, by adopting the bonding layer 200, the requirements of the bonding process on share force may be reduced, which may be conducive to achieving the bonding of the first chip 110 and the base substrate 300 in a short process time. Moreover, the bonding layer 200 is made of a photolithographic material (i.e., a photoresist material) and thus can be patterned through a photolithography process, any additional etching process may be avoided. As such, the disclosed method may not only facilitate the simplification of the steps of the patterning process and the improvement of the packaging efficiency and the production capacity, but also reduce the influence on the bonding strength of the bonding layer 200, which is conducive to improving the physical connection performance of the bonding layer 200.

In one embodiment, the bonding layer 200 may be made of a photolithographic dry film. The dry film may be a cohesive photoresist film used for fabricating semiconductor chip packages or printed circuit boards (PCBs). The dry film may be fabricated by coating a solventless photoresist on a polyester substrate followed by covering a polyethylene film on the top. When using the dry film, the polyethylene film may be removed, the solventless photoresist may then be pressed onto the substrate, and through an exposure and development process, a desired pattern may thus be formed in the dry film. In other embodiments, the bonding layer may be made of photolithographic polyimide, photolithographic polybenzoxazole (PBO), or photolithographic benzocyclobutene (BCB).

Referring to FIG. 4, in one embodiment, the bonding layer 200 may be formed on the second to-be bonded surface (not labeled) of the first chip 110. After the first chip 110 and the base substrate 300 are completely bonded by the bonding layer 200 in a subsequent process, the bonding layer may be only located between the first chip 110 and the base substrate 300. Accordingly, when an encapsulation layer is formed on the first to-be-bonded surface of the base substrate 300 in a subsequent process to cover the plurality of first chips 110, the encapsulation layer may be able to completely cover the bonding layer 200. Because the encapsulation layer demonstrates desired water absorption rate and chemical stability as compared to the bonding layer 200, completely covering the bonding layer by the encapsulation layer may be conducive to improving the yield and the reliability of the package structure. Moreover, the thermal expansion coefficient of the bonding layer may be significantly different from that of the first chip 110, the base substrate 300, and the subsequently-formed encapsulation layer, an excessively large amount of the material of the bonding layer 200 may easily cause problems (such as warping, etc.) associated with the mismatch in the thermal expansion coefficient. Therefore, by forming the bonding layer 200 on the second to-be-bonded surface, the amount of the material of the bonding layer 200 may be reduced, which may be beneficial to suppressing the problems caused by the mismatch in the thermal expansion coefficient.

For example, because the chip front side 101 of the first chip 110 is the second to-be-bonded surface, the bonding layer 200 may be formed on the chip front side 101.

In one embodiment, the first chip 110 may be integrated in the first device wafer 100, and thus the bonding layer 200 may be formed on the surface of the first device wafer 100 that corresponds to the second to-be-bonded surface. Forming the bonding layer 200 on the first device wafer 100 may be not only conducive to reducing the process difficulty and simplifying the process steps for forming the bonding layer 200, but also conducive to improving the packaging efficiency and the production capacity. In addition, forming the bonding layer 200 on the first device wafer 100 may also be conducive to improving the process operability for subsequently patterning the bonding layer 200.

In one embodiment, the bonding layer 200 may be formed on the surface of the first device wafer 100 through a lamination process. By adopting the lamination process, the bonding layer 200 may be attached onto the surface of the first device wafer 100 without generating bubbles. As such, the bonding strength between the bonding layer 200 and the first chip 110 may be improved.

It should be noted that in other embodiments, the bonding layer may be formed on the first to-be-bonded surface.

Figure 5:
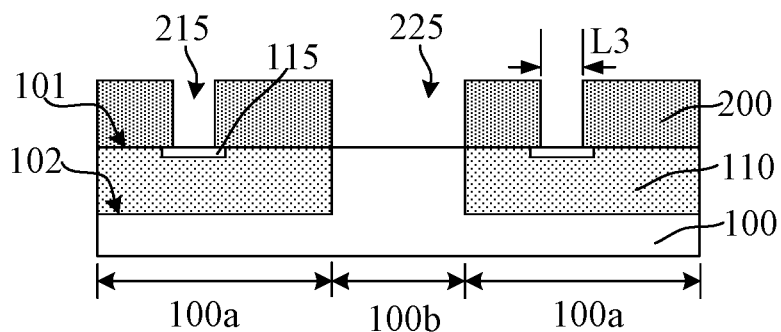

Further, returning to FIG. 15, the photolithographic bonding layer may be patterned to form a plurality of first vias in the photolithographic bonding layer (S403). FIG. 5 illustrates a schematic cross-sectional view of a structure consistent with various embodiments of the present disclosure.

Referring to FIG. 5, a plurality of first vias 215 may be formed in the photolithographic bonding layer 200 by patterning the photolithographic bonding layer 200.

In order to establish electrical connection between each first chip 110 and other electrical circuits (e.g., external electrical circuits), a conductive plug electrically connected to the first chip 110 may need to be formed in the bonding layer 200 in a subsequent process. Therefore, the first via 215 may be used to provide a space for forming the conductive plug. In one embodiment, each first via 215 may expose a second soldering pad 115.

In order to realize the normal operation function of the subsequently-formed package structure, the first via 215 may correspond to the first chip 110. For example, the first via 215 corresponds to the second soldering pad 115. In one embodiment, the first via 215 corresponding to the second soldering pad 115 may refer to that each first via 215 only exposes one second soldering pad 115, and the first via 215 and the second soldering pad 115 may have a preset position relationship.

In one embodiment, the bonding layer 200 may be patterned through a photolithography process. Through the photolithography process, the precision of the opening dimension L3 may be improved. Moreover, after patterning, the patterned bonding layer 200 may still demonstrate desired bonding strength, such that the bonding layer 200 may still be able to realize the bonding between the first chip 110 and the base substrate 300.

For example, patterning the bonding layer 200 through a photolithography process may include the following exemplary steps. An exposure process may be performed on the bonding layer 200. After the exposure process, a post-exposure baking (PEB) process may be performed on the bonding layer 200. Following the PEB process, a development process may be performed on the bonding layer 200 to remove a portion of the bonding layer 200. As such, the first via 215 may be formed in the bonding layer 200.

Through the exposure process, the pattern on the photomask may be transferred into the bonding layer 200. Specifically, when light enters the bonding layer 200 through the photomask, the photosensitive material in the portion of the bonding layer 200 exposed to the light may be decomposed through reaction, thereby achieving the goal of pattern transfer.

In one embodiment, the bonding layer 200 may be made of a negative photosensitive material. The negative photosensitive material may refer to a photosensitive material that will be retained in a development process after experiencing an exposure process, but will be removed in a development process without experiencing an exposure process. That is, in one embodiment, the exposed portion of the bonding layer 200 will be retained after the subsequently-performed development process, and the unexposed portion of the bonding layer 200 will be removed during the development process.

During the exposure process, the exposure energy may not be too small or too large. When the exposure energy is too small, the small exposure energy may easily cause an underexposure problem. As such, during the subsequent development process, not only the region of the bonding layer 200 corresponding to the position of the first via 215 may be removed, but other regions of the bonding layer 200 may also have a high loss rate. Therefore, the formation of the first via 215 may be affected. When the exposure energy is too large, the large exposure energy may easily cause an overexposure problem. As such, the precision of the opening dimension L3 (referring to FIG. 5) of the first via 215 and the topography quality (for example, the sidewall smoothness) of the first via 215 may be reduced. Therefore, in one embodiment, the exposure energy used in the exposure process may be in a range of approximately 80 mJ/cm$^2$ to 150 mJ/cm$^2$.

By performing the PEB process, the standing wave effect that is potentially induced during the exposure process may be suppressed or eliminated, and thus the sidewall smoothness of the first via 215 may be improved. In particular, because the first via 215 is used to expose the second soldering pad 115, the opening dimension L3 of the first via 215 may be usually small. Accordingly, the requirements on the precision of the opening dimension L3 of the first via 215 and on the topography quality of the first via 215 may be more stringent, and thus suppressing the standing wave effect may become particularly important.

During the PEB process, the process temperature may not be too low or too high. When the process temperature is too low, the suppression of the standing wave effect may not be sufficient. When the process temperature is too high, the excessively high process temperature may easily cause the material of the bonding layer 200 to flow. As such, the reaction may lower the self-quality of the bonding layer 200, thereby correspondingly affecting the formation of the first via 215. Therefore, in one embodiment, the process temperature used in the PEB process may be in a range of approximately 40° C. to 100° C.

During the PEB process, the process time may not be too short or too long. When the process time is too short, the suppression of the standing wave effect may not be sufficient. When the process time is too long, the excessively long process time may easily cause waste of the process time and cost, and thus reduce the manufacturing efficiency. Therefore, in one embodiment, the process time used for the PEB process may be in a range of approximately 3 minutes to 10 minutes.

Further, through a development process, the unexposed region of the bonding layer 200 may be removed. In one embodiment, the bonding layer 200 is made of a photolithographic dry film, and accordingly, an organic solvent, e.g., trichloroethane, may be used as the developer.

For example, the bonding layer 200 may be developed using a static puddle method. Using the static puddle method for the development process may be conducive to reducing the production cost.

During the development process, the development time may not be too short or too long. When the development time is too short, the short development time may easily result in an underdevelopment problem. As such, residue of the bonding layer 200 may easily remain in the exposed region, which may not only affect the precision of the opening dimension L3 of the first via 215 as well as the topography quality of the first via 215, but also increase the possibility that the first via 215 cannot expose the second soldering pad 115 such that the electrical connection between the second soldering pad 115 and other circuits may be affected. When the development time is too long, the overly long development time may easily cause an overdevelopment problem. As such, the probability of forming undercut defects in the first via 215 may be increased. Moreover, as the second soldering pad 115 is exposed to the developer, the process risk may be large. Therefore, in one embodiment, the development time may be in a range of approximately 4 minutes to 7 minutes.

In one embodiment, by appropriately selecting the process parameters for the photolithography process, the opening dimension L3 and the topography quality of the obtained first via 215 may meet the process requirements.

In one embodiment, the cross section of the first via 215 may have a circular shape, and thus the opening dimension L3 of the first via 215 may be the diameter of the first via 215.

In one embodiment, during the patterning process, an opening 225 (referring to FIG. 5) may also be formed in the bonding layer 200. The opening 225 may expose the portion of the first device wafer 100 in the scribe line region 100b.

In order to ensure the normal progress of the packaging process, the first device wafer 100 may be subsequently subjected to a dicing process performed along the scribe line region 100b. As such, the plurality of first chips 110 may be separated to a plurality of discrete first chips 110. In one embodiment, forming the opening 225 may help prevent the scriber-sticking problem during the subsequent dicing process, and thus improve the efficiency and the yield of the dicing process. In addition, forming the opening 225 may also be conducive to improving the sidewall smoothness of the first chips 110 obtained after the dicing process.

Figure 6:
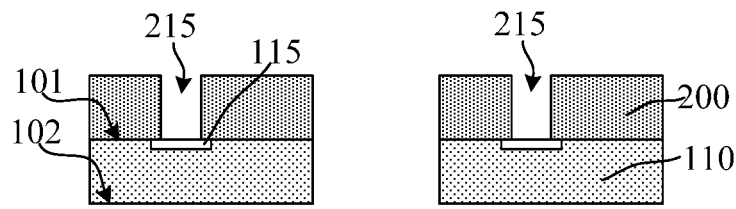

Therefore, referring to FIG. 15, after forming the photolithographic bonding layer, a dicing process may be performed on the first device wafer along a scribe line region to obtain a plurality of discrete first chips (S404). FIG. 6 illustrates a schematic cross-sectional view of the structures obtained after a dicing process according to various embodiments of the present disclosure.

Referring to FIG. 6, after forming the bonding layer 200, a dicing process may be performed on the first device wafer 100 along the scribe line region 100b (referring to FIG. 5). As such, the plurality of first chips 110 may be separated to a plurality of discrete first chips 110. The bonding layer 200 may cover the second to-be-bonded surface (not labeled) of each first chip 110. That is, after the dicing process, a plurality of discrete first chips 110 may be obtained, and each first chip 110 may include a bonding layer 200 covering the second to-be-bonded surface.

In one embodiment, a mechanical scribing or a laser saw scribing method may be adopted during the dicing process. The mechanical scribing method may be referred to as a blade saw scribing method.

Figure 7:
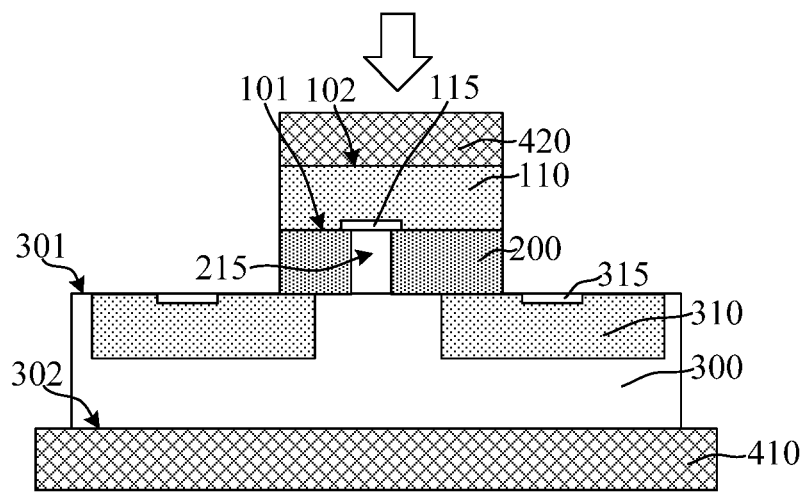

Further, returning to FIG. 15, a first chip may be prebonded to the base substrate through the photolithographic bonding layer by aligning the first chip with a corresponding first via (S405). FIG. 7 illustrates a schematic cross-sectional view of a semiconductor structure consistent with various embodiments of the present disclosure.

Referring to FIG. 7, a pre-bonding process may be performed to bond a first chip 110 to the base substrate 300 through the photolithographic bonding layer 200. After the pre-bonding process, the position of the first chip 110 may be aligned with the position of the first via 215. Through the pre-bonding process, a certain bonding strength may be established between the base substrate 300 and the first chip 110. As such, during subsequent processes, the probability to have the first chip 110 drifted may be reduced, which may be conducive to improving the packaging efficiency while ensuring that the yield and the reliability of the packaging process are improved.

For example, the first to-be-bonded surface (not labeled) and the second to-be-bonded surface (not labeled) may be arranged in opposite to each other, and then a pre-bonding process may be performed such that the base substrate 300 and the first chip 110 may be pre-bonded together through the bonding layer 200.

In one embodiment, the first to-be-bonded surface may be the wafer front side 301 of the base substrate 300, and the second to-be-bonded surface may be the chip front side 101 of the first chip 110. Therefore, the chip front side 101 and the wafer front side 301 may be arranged to face each other, and the bonding layer may be brought to contact the wafer front side 301, such that the first chip 110 may be pre-bonded to the wafer front side 301. In other embodiments, the first to-be-bonded surface may be the wafer back side of the base substrate, and accordingly, the first chip may be pre-bonded to the wafer back side.

In one embodiment, the bonding layer 200 is made of a photolithographic bonding material. Therefore, the bonding process may be a thermal compression bonding process. The thermal compression bonding process may include a pressing process and a heating process. The thermal compression bonding process is suitable for a bonding material that exhibits certain bonding ability only under heating conditions.

In the following, the pre-bonding process will be described in detail with reference to accompanying drawings.

Referring to FIG. 7, a plurality of first chips 110 may be placed on the base substrate 300. In one embodiment, a bonding apparatus (not shown) may be provided. The bonding apparatus may include a first heating plate 410 and a thermal pressing head 420. The first heating plate 410 and the thermal pressing head 420 may be disposed in a chamber of the bonding apparatus. The base substrate 300 may be placed on the first heating plate 410, and the chip back side 102 may be held on the thermal pressing head 420 through vacuum pumping. The first chip 110 may be placed at a preset position of the base substrate 300.

Further, referring to FIG. 7, a pre-heating process may be performed on the first chip 110 and the base substrate 300. After the pre-heating process, a first pressing process may be performed on at least one of the first chip 110 and the base substrate 300. During the first pressing process, a first heating process may be simultaneously performed on the first chip 110 and the base substrate 300.

Through the pre-heating process, the temperature of the first chip 110 and the base substrate 300 may reach a process temperature required for the subsequently-performed first heating process, and the bonding layer may become to have certain bonding ability (e.g., adhesive ability), and thus may be ready for the first pressing process and the first heating process that are subsequently performed. During the first heating process, the bonding layer 200 may be softened so that the bonding layer 200 may demonstrate desired bonding ability. As such, by performing the first pressing process, initial bonding between the first chip 110 and the bonding layer 200 may be achieved, that is, the first chip 110 and the bonding layer 200 may be initially bonded together.

In one embodiment, after placing the base substrate 300 on the first heating plate 410, the first heating plate 410 may be used to perform the pre-heating process on the base substrate 300. After holding the chip back side 102 on the thermal pressing head 420 through vacuum pumping, the thermal pressing head 420 may be used to perform the pre-heating process on the first chip 110.

During the pre-heating process, the process temperature may not be too low or too high. When the process temperature is too low, the bonding layer 200 may not be able to reach a softening temperature, such that the initial bonding effect of the first chip 110 and the base substrate 300 may not be desired. Moreover, with an insufficient process temperature, in order to ensure the initial bonding effect, the process time for the subsequent first pressing process and first heating process may need to be increased, which may result in a decrease in the packaging efficiency. When the process temperature is too high, the bonding layer 200 may easily melt and even be decomposed which, in turn, may cause a decrease in the yield and the reliability of the package structure. Therefore, in one embodiment, the process temperature used in the pre-heating process may be in a range of approximately 150° C. to 250° C.

The process time of the pre-heating process may not be too short or too long. When the process time is too short, the bonding layer 200 may not be able to reach the softening temperature, such that the initial bonding effect of the first chip 110 and the base substrate 300 may not be desired. Moreover, with a short process time for the pre-heating process, in order to ensure the initial bonding effect, the process time for the subsequent first pressing process and first heating process may need to be increased, which may result in a decrease in the packaging efficiency. When the process time of the pre-heating process is too long, the excessively long process time may easily cause waste of the process time, and thus reduce the packaging efficiency. Therefore, in one embodiment, the process time used for the pre-heating process may be in a range of approximately 1 minute to 5 minutes.

In one embodiment, in order to reduce the process difficulty of the bonding process and also improve the positional accuracy of the pressing region, during the first pressing process, as indicated by an arrow shown in FIG. 7, the first chip 110 may be pressed from the surface that faces away from the base substrate 300 (i.e., the chip back side 102). In addition, during the first pressing process, the first heating process may be simultaneously performed on the first chip 110 from the surface facing away from the base substrate 300 (i.e., the chip back side 102) and also on the base substrate 300 from the surface facing away from the first chip 110 (i.e., the wafer back side 302). That is, during the first heating process simultaneously performed with the first pressing process, the first chip 110 may be heated from the surface that faces away from the base substrate 300 and the base substrate 300 may be heated from the surface that faces away from the first chip 110.

For example, the first pressing process may be performed on the chip back side 102 through the thermal pressing head 420, the first heating process may be performed on the chip back side 102 through the thermal pressing head 420, and the first heating process may also be performed on the base substrate 300 through the first heating plate 410. The processing temperature of the first heating process may be the temperature of the thermal pressing head 420 and the first heating plate 410.

In one embodiment, the thermal pressing head 420 may sequentially place the plurality of first chips 110 on the base substrate 300, i.e., the plurality of first chips 110 may be placed on the base substrate 300 by the thermal pressing head 420 in a one-by-one manner. Further, once the thermal pressing head 420 places a first chip 110 to a preset position of the base substrate 300, the pre-bonding process may then be performed so that the first chip 110 may be pre-bonded to the base substrate 300. As such, the fabrication process may be relatively simple, which may be beneficial to improving the packaging efficiency and the production capacity.

In one embodiment, the process temperature of the first heating process may be the process temperature of the pre-heating process. Therefore, the process temperature of the first heating process may be in a range of approximately 150° C. to 250° C.

During the first pressing process, the applied pressure may not be too small or too large. When the pressure is too small, the small pressure may also result in undesired initial bonding effect of the first chip 110 and the base substrate 300. When the pressure is too large, the excessively large pressure may easily break the first chip 110, which may in turn cause a decrease in the yield and the reliability of the package structure. In addition, an excessively large pressure may also reduce the service life of bonding apparatus. Therefore, the pressure applied during the first pressing process may be in a range of approximately 100 N to 800 N.

In order to improve the packaging efficiency, during the first pressing process, the chip back side 102 may be rapidly pressed to achieve a desired initial bonding effect of the first chip 110 and the base substrate 300, and in the meantime, the process time for the first pressing process and the first heating process may be reduced as much as possible. Therefore, the process time for the first pressing process and the first heating process may not be too long; otherwise the packaging efficiency may be reduced. However, when the process time is too short, the initial bonding effect of the first chip 110 and the base substrate 300 may not be desired. Therefore, in one embodiment, the process time for the first pressing process and the first heating process may be in a range of approximately 1 second to 60 seconds.

During an actual packaging process, the process temperature of the pre-heating process, the process time of the pre-heating process, the pressure of the first pressing process, and the process time of the first pressing process and the first heating process may be properly selected to match with each other, such that while ensuring the initial bonding effect, the packaging efficiency may also be improved.

Figure 8:
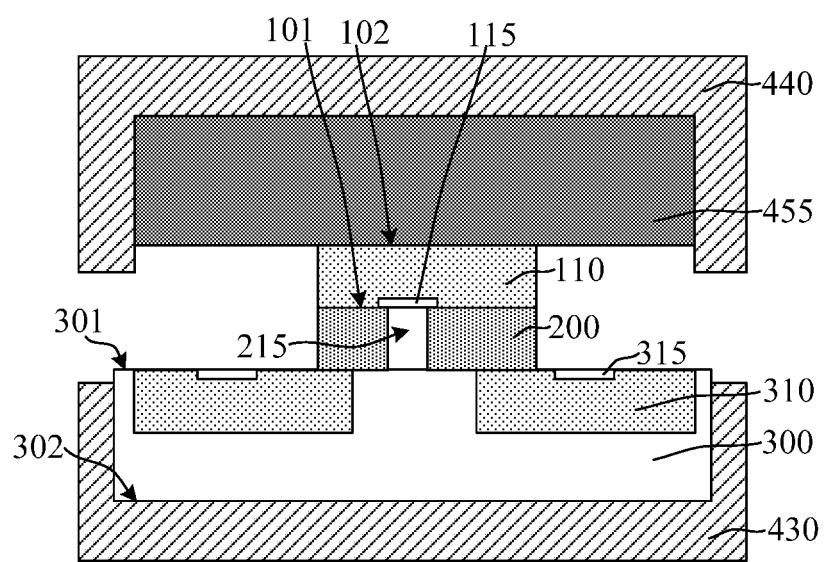

Further, returning to FIG. 15, an encapsulation material may be provided (S406). FIG. 8 illustrates a schematic diagram of providing an encapsulation material according to various embodiments of the present disclosure.

Referring to FIG. 8, an encapsulation material 455 may be provided. The encapsulation material 455 may be used to provide a process basis for subsequent formation of the encapsulation layer. In one embodiment, the encapsulation material 455 may be a film type encapsulation material.

In one embodiment, by selecting an appropriate film type encapsulation material, the lateral impact force to the first chip 110 during a subsequent thermal compression bonding process may be reduced, as such, the probability of having the first chip 110 drifted during the thermal compression bonding process may be effectively reduced, which may be conducive to further improving the yield and the reliability of the formed package structure.

In other embodiments, the encapsulation material may be a liquid encapsulation material or a powdered encapsulation material.

In one embodiment, the main material of the encapsulation material 455 may be an epoxy resin. By using an epoxy resin as the main material, the encapsulation material 455 may become a softened material layer when reaching a softening temperature, such that breaking the encapsulation material 455 under the pressure condition of the thermal compression bonding process may be prevented. In addition, epoxy resin has been widely used as an encapsulation material for electronic devices and ICs due to a number of advantages that the material demonstrates, including low contraction ratio, high adhesion, strong resistant to corrosion, desired electrical performance, low cost, etc.

Figure 9:
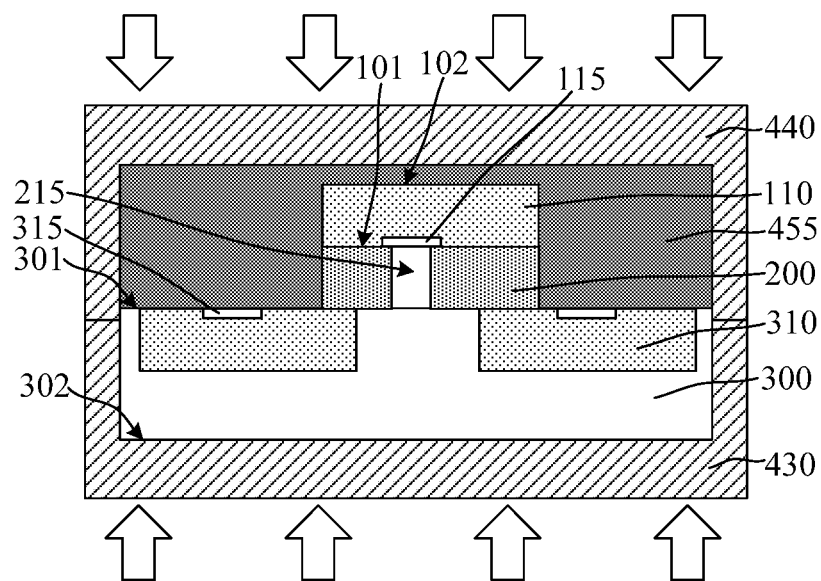

Further, returning to FIG. 15, a thermal compression bonding process may be performed to bond the plurality of discrete first chips to the base substrate through the bonding layer, and after the thermal compression bonding process, the encapsulation material may become an encapsulation layer covering the plurality of first chips and the base substrate and also filling up the space between adjacent first chips (S407). FIG. 9 illustrates a schematic diagram of performing a thermal compression bonding process, and FIG. 10 illustrates a schematic cross-sectional view of a semiconductor structure consistent with various embodiments of the present disclosure.

Figure 10:
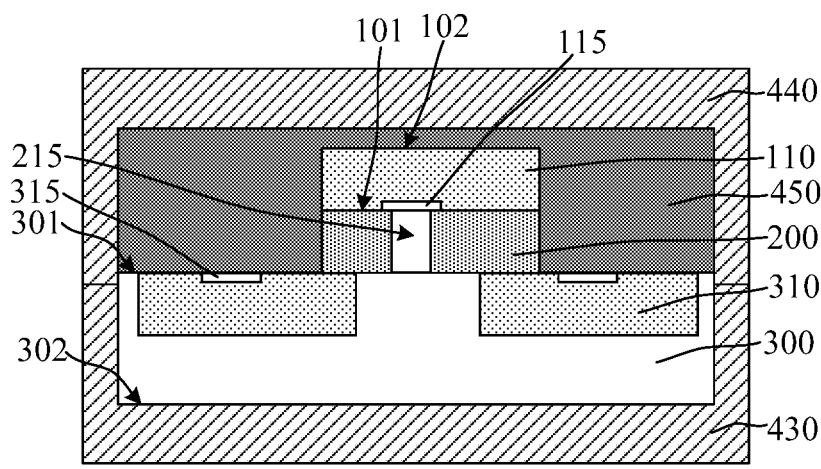

Referring to FIGS. 9-10, a thermal compression bonding process may be performed to bond the plurality of first chips 110 to the base substrate 300 through the bonding layer 200. After the thermal compression bonding process, the encapsulation material 455 (referring to FIG. 8) may fill up the space between adjacent first chips 110, and may also cover the plurality of first chips 110 and the base substrate 300. The encapsulation material 455 may become an encapsulation layer 450. In one embodiment, a thermal solidification process may be performed on the encapsulation material 455 to form the encapsulation layer 450.

In one embodiment, through the thermal compression bonding process, the encapsulation material 455 may be softened. Under a certain pressure condition, the softened encapsulation material 455 may be pressed into the space between adjacent first chips 110. As such, the encapsulation material 455 may be tightly attached onto the plurality of first chips 110, the bonding layer 200, and the portion of the wafer front side 301 exposed by the plurality of first chips 110. Moreover, because the bonding layer 200 has desired bonding ability, during the process of forming the encapsulation layer 450, the first chip 110 and the base substrate 300 may be simultaneously bonded together. The thermal compression bonding process may be a pressing process performed at a preset temperature.

Currently, according to WLSIP or PLSIP, a plurality of chips is bonded to a wafer or other base substrate in a one-by-one manner. Therefore, due to the large number of the chips, the time for bonding the chips to the base substrate is relatively long. For example, the time for bonding the chips to the base substrate is usually in a range from 300 seconds to 600 seconds. According to the disclosed packaging method, the process time of the pre-bonding process may be properly controlled, and when subsequently forming the encapsulation layer 450, complete bonding of the first chip 110 and the base substrate 300 may be simultaneously achieved. As such, the process cycle of the packaging process may be shortened while high bonding strength between the base substrate 300 and the first chip 110 is ensured. Therefore, the efficiency and the production capacity may be improved.

Therefore, through the thermal compression bonding process, the requirements for improving the yield and the reliability of the package structure and the requirements for improving the packaging efficiency can be balanced. In addition, the thermal compression bonding process may be conducive to reducing the thickness of the formed encapsulation layer 450, such that the dimension of the package structure may become smaller. Therefore, while ensuring the yield and the reliability of the package structure, the disclosed method may also be conducive to meeting the requirements for the miniaturization of the package structure.

The encapsulation layer 450 may function as insulation, sealing, and moisture proof, and may reduce the probability that the first chip 110 is damaged, contaminated, or oxidized. Therefore, the encapsulation layer 450 may be beneficial to improving the yield and the reliability of the formed package structure. In one embodiment, the main material of the encapsulation layer 450 may be an epoxy resin.

In one embodiment, the thermal compression bonding process may be a thermal compression molding process, or a thermal lamination process.

For example, the thermal compression bonding process may include the following exemplary steps. First, referring to FIG. 8, the encapsulation material 455 may be placed on the plurality of first chips 110, such that the plurality of first chips 110 may be in contact with the encapsulation material 455. After placing the encapsulation material 455 on the plurality of first chips 110, a vacuum process and a second heating process may be performed to bring the process pressure of the thermal compression bonding process to a preset pressure and the process temperature of the thermal compression bonding process to a preset temperature. Further, referring to FIG. 9, under the preset pressure and the preset temperature, a second pressing process may be performed on the base substrate 300 and the encapsulation material 455 for a preset time period, such that the encapsulation material 455 may be able to fill the space between the plurality of first chips 110 and also cover the plurality of first chips 110, the bonding layer 220, and the base substrate 300. In addition, the second pressing process may also realize the bonding between the base substrate 300 and the plurality of first chips 110. Moreover, referring to FIG. 10, after performing the second pressing process at the preset pressure and the preset temperature, a thermal solidification process may be performed on the encapsulation material 455 (referring to FIG. 9) under the preset temperature to form the encapsulation layer 450.

In one embodiment, a thermal compression molding process may be provided as an example of the thermal compressing bonding process for illustration. For example, referring to FIG. 8, a thermal compression apparatus (not shown) may be provided. A lower plate 430 and an upper plate 400 may be disposed in a chamber (not shown) of the thermal compression apparatus. The base substrate 300 may be placed on the lower plate 430. After placing the base substrate 300 on the lower plate 430, the encapsulation material 455 may be placed on the plurality of first chips 110. Further, after placing the encapsulation material 455 on the plurality of first chips 110, the upper plate 440 may be placed on the encapsulation material 455. After placing the upper plate 440 on the encapsulation material 455, the chamber of the thermal compression apparatus may be pumped to bring the chamber pressure of the thermal compression apparatus to a preset pressure, and also the lower plate 430 and the upper plate 440 may be heated to a preset temperature. Further, under the preset pressure and the preset temperature, as indicated in FIG. 9, a second pressing process may be performed on the base substrate 300 and the encapsulation material 455 for a preset time through the lower plate 430 and the upper plate 440. During the second pressing process, the encapsulation material 455 may be able to fill up the space between adjacent first chips 110 and cover the plurality of first chips 110, the bonding layer 200, and the base substrate 300. Through the second pressing process, complete bonding between the base substrate 300 and the plurality of first chips 110 may also be achieved. Referring to FIG. 10, after performing the second pressing process under the preset pressure and the preset temperature, a thermal solidification process may be performed on the encapsulation material 455 (referring to FIG. 9) under the preset temperature to form the encapsulation layer 450.

In some other embodiments, when the encapsulation material is a film type encapsulation material, the encapsulation material may be placed on the lower plate, and through a pumping method, the base substrate may be held on the upper plate. Further, the plurality of first chips may be brought to be in contact with the encapsulation material.

In some other embodiments, when the encapsulation material is a liquid encapsulation material or a powdered encapsulation material, the encapsulation material may thus be placed on the lower plate, and the base substrate may be held on the upper plate through pumping. For example, the lower plate may carry the encapsulation material, and the encapsulation material may be pre-heated through the lower plate such that the encapsulation material may be softened or liquefied.

In other embodiments, when the thermal compression bonding process is a thermal lamination process, a thermal lamination apparatus may be used to perform the thermal compression bonding process. The thermal lamination apparatus may correspondingly include a heatable and pressurizable roller shaft, and a heatable and pressurizable platform. The encapsulation material may be wrapped around the roller shaft. Through the roller shaft, not only the encapsulation material can be placed on the first chip, but also the heating and the pressing functions may be simultaneously achieved. That is, after the encapsulation material is placed on the first chip using the roller shaft, the bonding of the base substrate and the first chip and the formation of the encapsulation layer can be realized. Therefore, the process is relatively simple.

In one embodiment, after placing the upper plate 440 on the encapsulation material 455, the chamber of the thermal compression apparatus may start to be pumped, and the lower plate 430 and the upper plate 440 may also start to be heated. As such, the chamber pressure of the thermal compression apparatus may be able to reach the preset pressure and the temperature of the lower plate 430 and the upper plate 440 may be able reach the preset temperature, thereby providing a process basis for the subsequently-performed second pressing process.

During the thermal compression bonding process, the preset temperature may not be too low or too high. When the preset temperature is too low, the softening temperature of the encapsulation material 455 may not be able to reach, that is, the encapsulation material 455 may unlikely enter the semi-solidified state. As such, during the subsequent thermal solidification process, the encapsulation material 455 may not be tightly attached onto the plurality of first chips 110, the bonding layer 200, and the portion of the wafer front side 301 exposed by the plurality of first chips 110. When the preset temperature is overly high, not only the quality and the performance of the encapsulation material 455 may be affected, but also the performance of the first chip 110 may be degraded. In addition, during a subsequent cooling process, the encapsulation layer 450 may likely have a shrinking problem, which may in turn reduce the yield and the reliability of the formed package structure. Therefore, in one embodiment, the preset temperature may be in a range of approximately 120° C. to 180° C.

During the thermal compression bonding process, the preset pressure may not be too low or too high. When the preset pressure is lower, the vacuum degree of the chamber of the thermal compression apparatus is higher. Increasing the vacuum degree may be conducive to evacuate the residual air at the contact interface between the encapsulation material 455 and the first chip 110, the residual air at the contact interface between the encapsulation material 455 and the bonding layer 200, and the residual air at the contact interface between the encapsulation material 455 and the base substrate 300. As such, air bubbles at the contact interfaces may be reduced, such that the probability of having the first chip 110 oxidized may be reduced. However, when the preset pressure is too small, i.e. the vacuum degree is too high, process cost and process time may be increased. Therefore, in one embodiment, the preset pressure may be in a range of approximately 5 kPa to 15 kPa.

During the thermal compression bonding process, the pressure used in the second pressing process may not be too low or too high. The second pressing process to be performed on the base substrate 300 and the encapsulation material 455 through the lower plate 430 and the upper plate 440 of the thermal compression apparatus. Therefore, the larger the pressure used in the second pressing process, the larger the pressure applied to the encapsulation material 455 and the base substrate 300. Therefore, with a large pressure used in the second pressing process, the effect of the encapsulation material 455 filling between adjacent first chips 110 and covering the first chips 110, the bonding layer 200, and the base substrate 300 may be more desired. In addition, with a large pressure used in the second pressing process, the bonding effect of the base substrate 300 and the plurality of first chips 110 may also be more desirable. However, when the pressure of the second pressing process is too large, the first chip 110 may be easily broken, and accordingly, the yield and the reliability of the package structure may be reduced. In addition, an excessively large pressure used in the second pressing process may also easily reduce the service life of the apparatus used for the thermal compression bonding process. Therefore, in one embodiment, the pressure used in the second pressing process may be in a range of approximately 0.1 MPa to 10 MPa.

For example, according to the actual performance of the apparatus used for the thermal compression bonding process, when the thermal compression bonding process is a thermal compression molding process, the pressure used in the second pressing process may be in a range of approximately 3 MPa to 10 MPa; and when the thermal compression bonding process is a thermal lamination process, the pressure used in the second pressing process may be in a range of approximately 0.1 MPa to 3 MPa.

During the thermal compression bonding process, the preset time may not be too short or too long. When the preset time is too short, the effect of the encapsulation material 455 filling between adjacent first chips 110 and covering the first chips 110, the bonding layer 200, and the base substrate 300 may be easily degraded. In addition, the short preset time may also easily degrade the bonding effect of the base substrate 300 and the first chip 110. When the preset time is too long, the packaging efficiency may be reduced. Therefore, in one embodiment, the preset time may be in a range of approximately 30 seconds to 60 seconds.

During the thermal compression bonding process, the preset temperature, the preset pressure, the pressure used in the second pressing process, and the time that the second pressing process is performed under the present temperature and the preset pressure may be properly selected to match with each other, such that while ensuring the yield and the reliability of the formed package structure, the packaging efficiency may also be improved. Moreover, according to the process type of the thermal compression bonding process, the preset temperature, the preset pressure, and the time that the second pressing process is performed under the present temperature and the preset pressure may be properly adjusted to ensure that the thermal compression molding process and the thermal lamination process may have similar or same process effects.

After the second pressing process, the thermal compression bonding process may include a thermal solidification process performed on the encapsulation material 455. The thermal solidification process may be used to provide the energy and the time required for the encapsulation material 455 to cure and form crosslinks. In one embodiment, during the thermal solidification process, the encapsulation material 455 may be incubated in an environment at the preset temperature, so that the polymer resin in the encapsulation material 455 may be transformed into a gel and may gradually harden. Polymer chains in the solidified (i.e., cured) state may not be able to move due to cross-linking and mutual binding. Therefore, the thermal solidification effect may be achieved, and thus an encapsulation layer 450 with high hardness and high performance may be further formed.

During the thermal compression bonding process, the process time of the thermal solidification process may not be too short or too long. When the process time of the thermal solidification process is too short, the effect of the thermal solidification process may be degraded, leading to a decrease in the quality and the performance of the encapsulation layer 450. When the process time of the thermal solidification process is too long, the process time may easily be wasted, and thus the packaging efficiency may be reduced. Therefore, in one embodiment, the process time used for the thermal solidification process may be in a range of approximately 300 seconds to 600 seconds.

In one embodiment, after the thermal solidification process, the semiconductor structure may be naturally cooled under a normal pressure, such that the internal stress in the encapsulation layer 450 may be gradually reduced, and thus the probability of causing problems such as plate bending, plate warping, etc. may be reduced.

Figure 11:
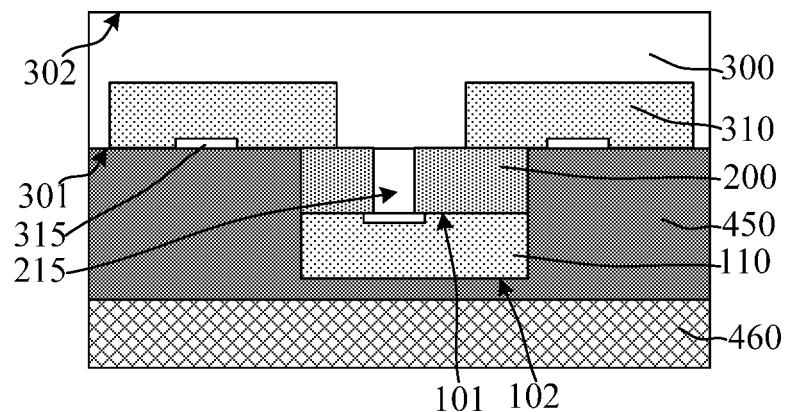

Further, returning to FIG. 15, after performing the thermal compression bonding process, the fabrication method may further include temporarily bonding the side of the encapsulation layer that faces away from the base substrate to a carrier substrate (S408). FIG. 11 illustrates a schematic cross-sectional view of a semiconductor structure consistent with various embodiments of the present disclosure.

Referring to FIG. 11, after performing the thermal compression bonding process, the side of the encapsulation layer 450 that faces away from the base substrate 300 may be temporarily bonded to a carrier substrate 460.

The carrier substrate 460 may be used to provide a process platform for subsequent steps, and thus improve the operability of the fabrication process. The carrier substrate 460 may also be able to provide protection for the side of the encapsulation layer 450 that faces away from the base substrate 300 during subsequent fabrication processes. In addition, through temporary bonding, it may also be convenient to separate the encapsulation layer 450 and the carrier substrate 460 in a subsequent process.

In one embodiment, the carrier substrate 460 may be a carrier wafer. In other embodiments, the carrier substrate may be any other appropriate type of substrate.

In one embodiment, the encapsulation layer 450 may be bonded to the carrier substrate 460 from the side that faces away from the base substrate 300 using an adhesive layer (not shown). The adhesive layer may act as a peeling layer to facilitate the subsequent separation of the encapsulation layer 450 and the carrier substrate 460. The adhesive layer may be a die attached film (DAF) or a foamed film.

In other embodiments, the encapsulation layer may be temporarily bonded to the carrier substrate through electrostatic bonding.

In one embodiment, after temporarily bonding the encapsulation layer and the carrier substrate, the fabrication method may also include performing a thinning-down process from the wafer back side 302. Through the thinning-down process, the thickness of the base substrate 300 may be reduced, such that the heat dispassion ability of the base substrate 300 may be improved. Moreover, a reduced thickness of the base substrate 300 may also be conducive to performing a subsequent packaging process and reducing the overall thickness of the package structure obtained after the packing process.

In one embodiment, the thinning-down process may include one or more of a back grinding process, a chemical mechanical polishing (CMP) process, and a wet etching process.

It should be noted that using the thinning-down process, the carrier substrate 460 may be able to fix and support the semiconductor structure, which further reduces the possibility of having the first chip 110 peeling off from the base substrate 300. Moreover, through the carrier substrate 460, the possibility that the encapsulation layer 450 is damaged may also be reduced.

Figure 12:
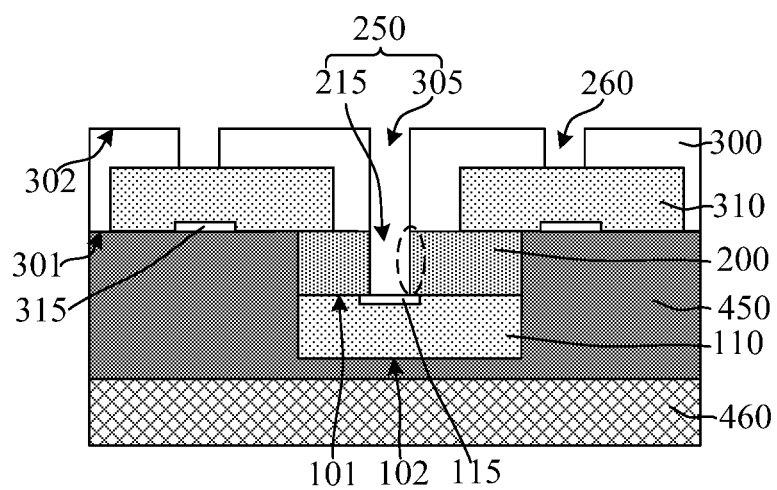

Further, returning to FIG. 15, the surface of the base substrate that faces away from the first chip may be etched to form a second via penetrating through the base substrate and connected to the first via; and the second via and the first via may together be used to form a first conductive via (S409). FIG. 12 illustrates a schematic cross-sectional view of a semiconductor structure consistent with various embodiments of the present disclosure.

Referring to FIG. 12, the base substrate 300 may be etched from the surface that faces away from the first chip 110. A second via 305 may thus be formed through the base substrate 300. The second via 305 may be connected to the first via 215, and the first via 215 and the second via 305 may together be used to form a first conductive via 250.

The first conductive via 250 may be used to provide a space for a first conductive plug that is subsequently formed to electrically connect to the first chip.

In one embodiment, the second via 305 may be formed by a through-silicon via etching process. The through-silicon via etching process may be a dry etching process, a wet etching process, or a process combining both dry etching and wet etching. In one embodiment, the process for etching the base substrate 300 may include the following exemplary steps. A portion of the base substrate 300 may be etched by a dry etching process. That is, the thickness of the base substrate 300 may be partially removed during the dry etching process. After the dry etching process, the remaining portion of the base substrate 300 may be etched by a wet etching process to form the second via 305 penetrating through the entire thickness of the base substrate 300. By performing a dry etching process followed by a wet etching process, the etching method may be able to avoid etching loss of the bonding layer 200 and the first chip 110 while improving the etching efficiency. In addition, the method may also be conducive to reducing the impact on the opening dimension L3 (Referring to FIG. 5) of the first via 215.

It should be noted that according to the embodiments of the present disclosure, prior to etching the base substrate 300, a first via 215 has been formed in the bonding layer 200. The opening dimension L3 (referring to FIG. 5) of the first via 215 may be defined through the patterning process performed on the bonding material layer 205 (referring to FIG. 4), such that the opening dimension L3 of the first via 215 may meet the process requirements. Therefore, compared to a fabrication method in which the base substrate and the bonding material layer are sequentially etched to form a second via in the base substrate and then form a first via in the bonding material layer to connect to the second via, the disclosed method may be able to avoid severe lateral etching of the bonding material layer. As such, the disclosed method may avoid the problem of having the opening dimension L3 of the first via 215 larger than the opening dimension (not labeled) of the second via 305, and thus avoid the problem that the base substrate 300, the first chip 110, and the bonding layer 200 form a trench in a region adjacent to the sidewall of the first via 215 (as indicated by the dashed circle in FIG. 12).

In one embodiment, the cross section of the second via 305 may have a circular shape, and thus the opening dimension of the second via 305 may be the diameter of the second via 305.

In one embodiment, the packaging method may further include etching the base substrate 300 from the surface facing away from the first chip 110 to form a second conductive via 260. The second conductive via 260 formed in the base substrate 300 may be used to provide a space for a second conductive plug that is subsequently formed to electrically connect to a second chip 310.

In one embodiment, the second conductive via 260 and the second via 305 may be separately formed in the base substrate 300 through different etching steps.

In one embodiment, a process in which the second conductive via 260 is formed prior to forming the second via 205 is described an example for illustration. For example, the wafer back side 302 may be etched to form a second conductive via 260 in the base substrate 300. A filling layer (not shown) may be formed in the second conductive via 260. The filling layer may also cover the wafer back side 302. A patterned layer (not shown) may be formed on the filling layer, and the pattern layer may include a patterned opening (not shown) exposing the portion of the filling layer above the first via 215. The filling layer and the base substrate 300 may be sequentially etching along the patterned opening using the patterned layer as an etch mask. As such, a second via 305 penetrating through the base substrate 300 and connected with the first via 215 may be formed in the base substrate 300. After forming the second via 305, the patterned layer and the filling layer may then be removed.

In one embodiment, the depth of the second conductive via 260 may be small. Therefore, by forming the second conductive via 260 first and then forming the second via 305, the process difficulty in removing the filling layer may be reduced. In other embodiments, the second via may be formed prior to forming the second conductive via.

Further, returning to FIG. 15, a seed layer may be formed on the bottom and sidewall surfaces of each first conductive via and also on the wafer back side (S410). FIG. 13 illustrates a schematic cross-sectional view of a semiconductor structure consistent with various embodiments of the present disclosure.

Referring to FIG. 13, a seed layer 510 may be formed on the bottom and sidewall surfaces of each first conductive via 250. The seed layer 510 may also cover the wafer back side 302 and the bottom and sidewall surfaces of each second conductive via 260.

In one embodiment, the seed layer 510 may be formed by a physical vapor deposition (PVD) process. Moreover, because in a subsequent process, a first conductive plug formed in each first conductive via 250 and a second conductive plug formed in each second conductive via 260 are made of copper, the seed layer 510 may correspondingly made of copper.

Further, returning to FIG. 15, a first conductive plug may be formed in each first conductive via to electrically connect to the first chip (S411). FIG. 14 illustrates a schematic cross-sectional view of a semiconductor structure consistent with various embodiments of the present disclosure.

Referring to FIG. 14, after forming the seed layer 510, a first conductive plug 520 may be formed in each first conductive via 250 to electrically connect to the corresponding first chip 110. In one embodiment, during the formation of the first conductive plug 520, a second conductive plug 530 may also be formed in each second conductive via 260 to electrically connect to the corresponding second chip 310. That is, the first conductive plug 520 may be used to connect the corresponding first chip 110 to the external circuits and the second conductive plug 530 may be used to connect the corresponding second chip 310 to the external circuits. Moreover, through the first conductive plug 520 and the second conductive plug 530, electrical connection between the first chip 110 and the second chip 310 may be established.

In one embodiment, the first conductive plug 520 and the second conductive plug 530 may be made of copper. In other embodiments, the first conductive plug and the second conductive plug may be made of any appropriate conductive material, including aluminum, tungsten, titanium, etc., according to the actual process needs. Moreover, the seed layer may also be made of a same material as he first conductive plug and the second conductive plug.

In one embodiment, after forming the seed layer 510, an electrochemical plating (ECP) process may be performed to fill a conductive material layer (not shown) into each first conductive via 250 and each second conductive via 260. The conductive material layer may also cover the seed layer 510 formed on the wafer back side 302. Further, a planarization process may be performed on the conductive material layer and the seed layer 510 to remove the portion of the conductive material layer and the seed layer 510 formed above the surface of the wafer back side 302. After the planarization process, the remaining portion of the conductive material layer in the first conductive via 250 may serve as the first conductive plug 520, and the remaining portion of the conductive material layer in the second conductive via 260 may serve as the second conductive plug 530.

According to the disclosed WLP methods, the second via 305 is formed after the formation of the first via 215. Therefore, in the region close to the sidewall of the first via 215 (indicated by the dashed circle in FIG. 12), the probability of forming a trench surrounded by the base substrate 300, the first chip 110, and the bonding layer 200 may be low. As such, the quality of the seed layer 510 formed in the first via 215 may be desired, which may correspondingly improve the filling effect of the conductive material in the first via 215. Therefore, the performance of the electrical connection of the first conductive plug 520 may be improved, and thus the yield and the reliability of the package structure may also be improved.

Compared to existing packaging method, the disclosed WLP methods using photolithographic bonding materials demonstrate the following advantages.

According to the disclosed WLP method, a first via is formed in the bonding layer through a photolithography process, and a second via may then be formed by etching the base substrate. As such, severe lateral etching of the bonding layer may be avoided, and thus the problem of having the opening dimension of the first via larger than the opening dimension of the second via may be avoided. In addition, the precision of the opening dimension of the via formed through the photolithography process may also be improved. Accordingly, when a first conductive plug is subsequently formed in a first conductive via, which is formed by the first via and the second via, to electrically connect to the first chip, the disclosed WLP method may be conducive to reducing the difficulty in forming the first conductive plug in the first via and improving the formation quality of the first conductive plug in the first via. Therefore, the performance of the electrical connection of the first conductive plug may be improved, and thus the yield and the reliability of the package structure may also be improved. Moreover, after the base substrate and the first chip are pre-bonded together through the bonding layer disposed therebetween, a thermal compression bonding process is used to simultaneously implement the bonding of the base substrate and the first chip and the packaging of the first chip and the base substrate using the encapsulation layer. Therefore, while the high bonding strength between the base substrate and the first chip is ensured, the process cycle of the packaging process is reduced, and thus the packaging efficiency and the production capacity may be improved.

The details of the present disclosure have been described through the embodiments provided above. However, it should be understood that the above embodiments are only for the purpose of illustration and description. Further, those skilled in the art can understand that the present disclosure is not limited to the above embodiments, and various modifications and changes can be made according to the principles of the present disclosure. These modifications and modifications are all in the scope of the present disclosure. The scope of the present disclosure is defined by the appended claims and their equivalents.

What is claimed is:

1. A wafer-level packaging method using a photolithographic bonding material, comprising:
    providing a base substrate;
    providing a plurality of first chips;
    forming a photolithographic bonding layer on the base substrate or on the plurality of first chips;
    forming a plurality of first vias in the photolithographic bonding layer by patterning the photolithographic bonding layer;
    pre-bonding the plurality of first chips to the base substrate through the photolithographic bonding layer, wherein each first chip of the plurality of first chips corresponds to a first via of the plurality of first vias;
    providing an encapsulation material, and using a thermal compression bonding process to bond the plurality of first chips to the base substrate such that the encapsulation material fills up space between adjacent first chips and covers the plurality of first chips and the base substrate;
    after bonding the plurality of first chips to the base substrate, etching the base substrate from a surface that faces away from the plurality of first chips to form a plurality of second vias passing through the base substrate, wherein, each second via of the plurality of second vias is connected to a first via of the plurality of first vias to form a first conductive via; and
    forming a first conductive plug in the first conductive via to electrically connect to a corresponding first chip.

2. The packaging method according to claim 1, wherein:
    the plurality of first chips is integrated in a first device wafer;
    the photolithographic bonding layer is formed on the first device wafer; and
    after forming the plurality of first vias and prior to pre-bonding the plurality of first chips to the base substrate, the method further includes:
        dicing the first device wafer to obtain a plurality of discrete first chips.

3. The packaging method according to claim 2, wherein:
    the first device wafer includes a plurality of device regions and a scribe line region surrounding the plurality of device regions;
    forming the plurality of first vias by patterning the photolithographic bonding layer includes forming an opening in the photolithographic bonding layer to expose a portion of the first device wafer in the scribe line region.

4. The packaging method according to claim 1, wherein:
    the plurality of first chips is unintegrated and is separated from each other.

5. The packaging method according to claim 1, wherein pre-bonding the plurality of first chips to the base substrate through the photolithographic bonding layer includes:
    performing a pre-heating process on the plurality of first chips and the base substrate; and
    after performing the pre-heating process, performing a first pressing process through one or both of the plurality of first chips and the base substrate; and
    when performing the first pressing process, simultaneously performing a first heating process on the plurality of first chips and the base substrate.

6. The packaging method according to claim 5, wherein:
    during the first pressing process, the plurality of first chips is pressed from a surface that faces away from the base substrate; or
    during the first heating process, the plurality of first chips is heated from the surface that faces away from the base substrate, and the base substrate is heated from a surface that faces away from the plurality of first chips.

7. The packaging method according to claim 5, wherein when pre-bonding the plurality of first chips to the base substrate through the photolithographic bonding layer, process parameters adopted include:
    a process temperature of the pre-heating process in a range of approximately 150° C. to 250° C.;
    a process time of the pre-heating process in a range of approximately 1 minute to 5 minutes;
    a pressure applied in the first pressing process in a range of approximately 100 N to 800 N;
    a process temperature of the first heating process in a range of approximately 150° C. to 250° C.; and
    a process time of the first heating process in a range of approximately 1 second to 60 seconds.

8. The packaging method according to claim 1, wherein using the thermal compression bonding process to bond the plurality of first chips to the base substrate includes:
   performing a vacuum process and a second heating process to bring a process pressure of the thermal compression bonding process to a preset pressure and a process temperature of the thermal compression bonding process to a preset temperature;
   bringing the plurality of first chips to be in contact with the encapsulation material;
   under the preset pressure and the process temperature, performing a second pressing process on the base substrate and the encapsulation material for a preset time, wherein:
      after the second pressing process, the encapsulation material fills up the space between adjacent first chips and covers the plurality of first chips and the base substrate, and the plurality of first chips is bonded to the base substrate, and
   after the second pressing process, performing a thermal solidification process on the encapsulation material at the preset temperature.

9. The packaging method according to claim 8, wherein:
   the base substrate is a second device wafer, wherein a plurality of second chips is integrated in the second device wafer, a plurality of first soldering pads is formed in the plurality of second chips, a surface of the second device wafer exposing the plurality of first soldering pads is a wafer front side, and a surface of the second device wafer in opposite to the wafer front side is a wafer back side; and
   after performing the thermal compression bonding process, and prior to etching the base substrate from the surface that faces away from the first chip, the packaging method further includes performing a thinning-down process on the wafer back side.

10. The packaging method according to claim 9, wherein:
   after performing the thermal compression bonding process, the method further includes etching the base substrate from the surface that faces away from the plurality of first chips to form a plurality of second conductive vias in the base substrate; and
   when forming the first conductive plug in each first conductive via of the plurality of first vias, the method also includes forming a second conductive plug in each second conductive via of the plurality of second conductive vias to electrically connect to the second chip.

11. The packaging method according to claim 8, wherein when performing the thermal compression bonding process, process parameters adopted include:
   the preset pressure in a range of approximately 5 kPa to 15 kPa;
   the preset temperature in a range of approximately 120° C. to 180° C.;
   the pressure applied in the second pressing process in a range of approximately 0.1 MPa to 10 MPa;
   the preset time in a range of approximately 30 seconds to 60 seconds; and
   a process time of the thermal solidification in a range of approximately 300 seconds to 600 seconds.

12. The packaging method according to claim 1, wherein: the photolithographic bonding layer is formed through a lamination process.

13. The packaging method according to claim 1, wherein: the photolithographic bonding layer is made of a photolithographic dry film, or a material including photolithographic polyimide, photolithographic polybenzoxazole (PBO), or photolithographic benzocyclobutene (BCB).

14. The packaging method according to claim 1, wherein: the encapsulation material is a film type encapsulation material, a liquid encapsulation material, or a powdered encapsulation material.

15. The packaging method according to claim 1, wherein: etching the base substrate from the surface that faces away from the plurality of first chips includes performing a dry etching process, a wet etching process, or a processing combining both dry etching and wet etching.

16. The packaging method according to claim 1, wherein: the thermal compression bonding process is a thermal compression molding process or a thermal lamination process.

17. The packaging method according to claim 1, wherein the plurality of first vias is formed in the photolithographic bonding layer through a photolithography process, and process parameters adopted in the photolithography process include:
   an exposure energy in a range of approximately 80 mJ/cm$^2$ to 150 mJ/cm$^2$;
   a process temperature of a post-exposure baking (PEB) process in a range of approximately 40° C. to 100° C.;
   a process time of the PEB process in a range of approximately 3 minutes to 10 minutes; and
   a development time in a range of approximately 4 minutes to 7 minutes.

18. The packaging method according to claim 1, wherein:
   a second soldering pad is formed in each first chip of the plurality of first chips; and
   the second soldering pad is exposed by a first via of the plurality of first vias that corresponds to the first chip of the plurality of first chips.

19. The packaging method according to claim 1, wherein: the base substrate is a second device wafer, a carrier wafer, or a panel.

20. The packaging method according to claim 1, wherein:
   the base substrate is a second device wafer, wherein a plurality of second chips is integrated in the second device wafer, a plurality of first soldering pads is formed in the plurality of second chips, a surface of the second device wafer exposing the plurality of first soldering pads is a wafer front side, and a surface of the second device wafer in opposite to the wafer front side is a wafer back side; and
   the plurality of first chips is pre-bonded to the wafer front side or the wafer back side of the base substrate.

* * * * *